United States Patent
Wu

(10) Patent No.: US 9,584,158 B2
(45) Date of Patent: Feb. 28, 2017

(54) UNIFIED H-ENCODER FOR A CLASS OF MULTI-RATE LDPC CODES

(71) Applicant: Tidal Systems, Inc., Santa Clara, CA (US)

(72) Inventor: Yingquan Wu, Palo Alto, CA (US)

(73) Assignee: Tidal Systems, Inc., Santa Clara, CA (US)

( * ) Notice: Subject to any disclaimer, the term of this patent is extended or adjusted under 35 U.S.C. 154(b) by 5 days.

(21) Appl. No.: 14/808,717

(22) Filed: Jul. 24, 2015

(65) Prior Publication Data

US 2017/0026056 A1    Jan. 26, 2017

(51) Int. Cl.
*H03M 13/00* (2006.01)
*H03M 13/11* (2006.01)

(52) U.S. Cl.
CPC ...... *H03M 13/1117* (2013.01); *H03M 13/116* (2013.01); *H03M 13/616* (2013.01)

(58) Field of Classification Search
CPC ............ H03M 13/1117; H03M 13/116; H03M 13/616; H03M 13/033
See application file for complete search history.

(56) References Cited

U.S. PATENT DOCUMENTS

| | | | | |
|---|---|---|---|---|
| 7,543,212 B2* | 6/2009 | Miles | ................... | H03M 13/118 704/229 |
| 8,103,935 B2* | 1/2012 | Matsumoto | ........ | H03M 13/1117 714/758 |
| 8,171,371 B2* | 5/2012 | Matsumoto | .......... | H03M 13/116 714/758 |
| 8,316,287 B1* | 11/2012 | Varnica | ............... | H03M 13/036 714/746 |
| 8,392,787 B2* | 3/2013 | Shen | .................... | H03M 13/033 714/752 |
| 8,499,218 B2* | 7/2013 | Yedidia | ............... | H03M 13/036 714/752 |
| 8,504,894 B1* | 8/2013 | Zeng | .................... | H03M 13/116 714/758 |
| 8,595,589 B2* | 11/2013 | Yedidia | .............. | H03M 13/1154 714/752 |

(Continued)

OTHER PUBLICATIONS

Chen, et al. "Reduced-Complexity Decoding of LDPC Codes" IEEE Transactions on Communications, vol. 53, Issue 8, Aug. 2005, pp. 1288-1299.

(Continued)

*Primary Examiner* — Esaw Abraham
(74) *Attorney, Agent, or Firm* — Brooks, Cameron & Huebsch, PLLC

(57) ABSTRACT

A quasi-cyclic LDPC encoding apparatus is disclosed wherein a matrix H of the form [0 T; D E] is used, where T is a triangular matrix and D and E are arbitrary matrices selected to improve encoding performance. T and E vary with the size of an encoded data word whereas D is maintained constant. T and E are sparse such that encoding operations performed on them are computationally simple. Likewise D and its inverse are constant and pre-computed further reducing computation. T, E, and D and the inverse of D may be constrained to be quasi-cyclic, which reduces storage required to represent them and enables the performance of encoding operations using shift registers.

18 Claims, 3 Drawing Sheets

(56) References Cited

U.S. PATENT DOCUMENTS

| | | | | |
|---|---|---|---|---|
| 8,966,336 B2 * | 2/2015 | Shen | ................... | H03M 13/033 |
| | | | | 714/752 |
| 9,367,387 B2 * | 6/2016 | Djordjevic | .............. | G06F 11/10 |
| 9,450,612 B2 * | 9/2016 | Hu | ....................... | H03M 13/116 |

OTHER PUBLICATIONS

Mansour, et al. "High-Throughput LDPC decoders" IEEE Transactions on VLSI Systems, vol. 11, Issue 6, Dec. 2003, pp. 976-996.

Hocevar "A Reduced Complexity Decoder Architecture via Layered Decoding of LDPC Codes" IEEE Workshop on Signal Processing Systems Design and Implementation (SIPS), Oct. 2004, pp. 107-112.

Kim, et al. "A Reduced-Complexity Architecture for LDPC Layered Decoding Schemes" IEEE Transactions on VLSI Systems, vol. 19, Issue 6, Jun. 2011, pp. 1099-1103.

Zhang, et al. "Quantized Iterative Message Passing Decoders with Low Error Floor for LDPC Codes" IEEE Transactions on Communications, vol. 62, Issue 1, Jan. 2014, pp. 1-14.

Zhang, et al. "Shuffled Iterative Decoding" IEEE Transactions on Communications, vol. 53, Issue 2, Feb. 2005, pp. 209-213.

* cited by examiner

UNIFIED H-ENCODER FOR A CLASS OF MULTI-RATE LDPC CODES

BACKGROUND

Field of the Invention

This invention relates to systems and methods for implementing a low-density parity check (LDPC) decoding algorithm.

Background of the Invention
A. LDPC Codes and Min-Sum Decoding

Low-density parity-check (LDPC) codes were discovered by Gallager in 1962, and rediscovered and shown to be Shannon-limit approaching in the late 1990's. These codes, decoded with iterative decoding based on belief propagation, such as the sum-product algorithm (SPA), achieve near-capacity error performance [1].

Quasi-cyclic (QC) LDPC codes are a special class of the LDPC codes with structured H matrix which can be generated by the expansion of a $m_b \times n_b$ base matrix. Each 1's element in the base matrix can be expanded by a circularly right-shifted b×b identity sub-matrix. QC-LDPC codes have advantages over other types of LDPC codes in hardware implementations of both encoding and decoding. Encoding of a QC-LDPC code can be efficiently implemented using simple shift registers. In hardware implementation of a QC-LDPC decoder, the QC structure of the code simplifies the wire routing for message passing.

Richardson and Urbanke [2] showed there exists near-triangular sub-matrix $H_P$ in sparse matrix $H=[H_I, H_P]$, such that $$H_P = \begin{bmatrix} B & T \\ D & E \end{bmatrix} \quad (1)$$

where $H_P$ is an m×m matrix and retains the rank of H, and T is lower-triangular matrix whose dimension t is close to the full dimension m. An efficient encoding algorithm was derived exploiting the sparseness of $H_I$ (the identity matrix) and back-substitution over the lower-triangular matrix T. Myung, et al. [3] presented a special class of QC-LDPC codes which exhibit special near-lower-triangular QC H sub-matrix (i.e., H contains a lower triangular QC sub-matrix T whose dimension is near to m) and developed an efficient encoding algorithm which further incorporates the QC property into the back-substitution approach in [2]. For the practical LDPC coding system implementations, it has been well recognized that the conventional code-to-encoder/decoder design approach, i.e., first construct the code and then develop the encoder/decoder hardware implementations, is not the most efficient and a better solution is to jointly consider the code construction and encoder/decoder hardware implementation. This is referred to as joint LDPC coding system design. Zhong and Zhang [4] proposed a joint design of block-LDPC codes subject to certain hardware-oriented constraints that ensure the effective encoder and decoder hardware implementations. Consequently, the constructed codes enable a pipelined partially parallel block-LDPC encoder, following the methodology of [2], and a partially parallel block-LDPC decoder.

Li, et al. [5] showed the existence of QC generator matrix, denoted by G, for most QC-LDPC codes, and thus encoding may be carried out by multiplying an input data with the systematic QC G matrix. Xiang, et al. [6] presented an improved all-purpose multi-rate iterative decoder architecture for QC-LDPC codes, which implements the normalized min-sum algorithm, rearranges the original two-phase message-passing flow, and adopts an efficient quantization method for the second minimum absolute values, an optimized storing scheme for the position indexes and signs, and an elaborate clock gating technique for substantive memories and registers.

The systems and methods disclosed herein provide an improved approach for performing LDPC decoding using Tanner graphs.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
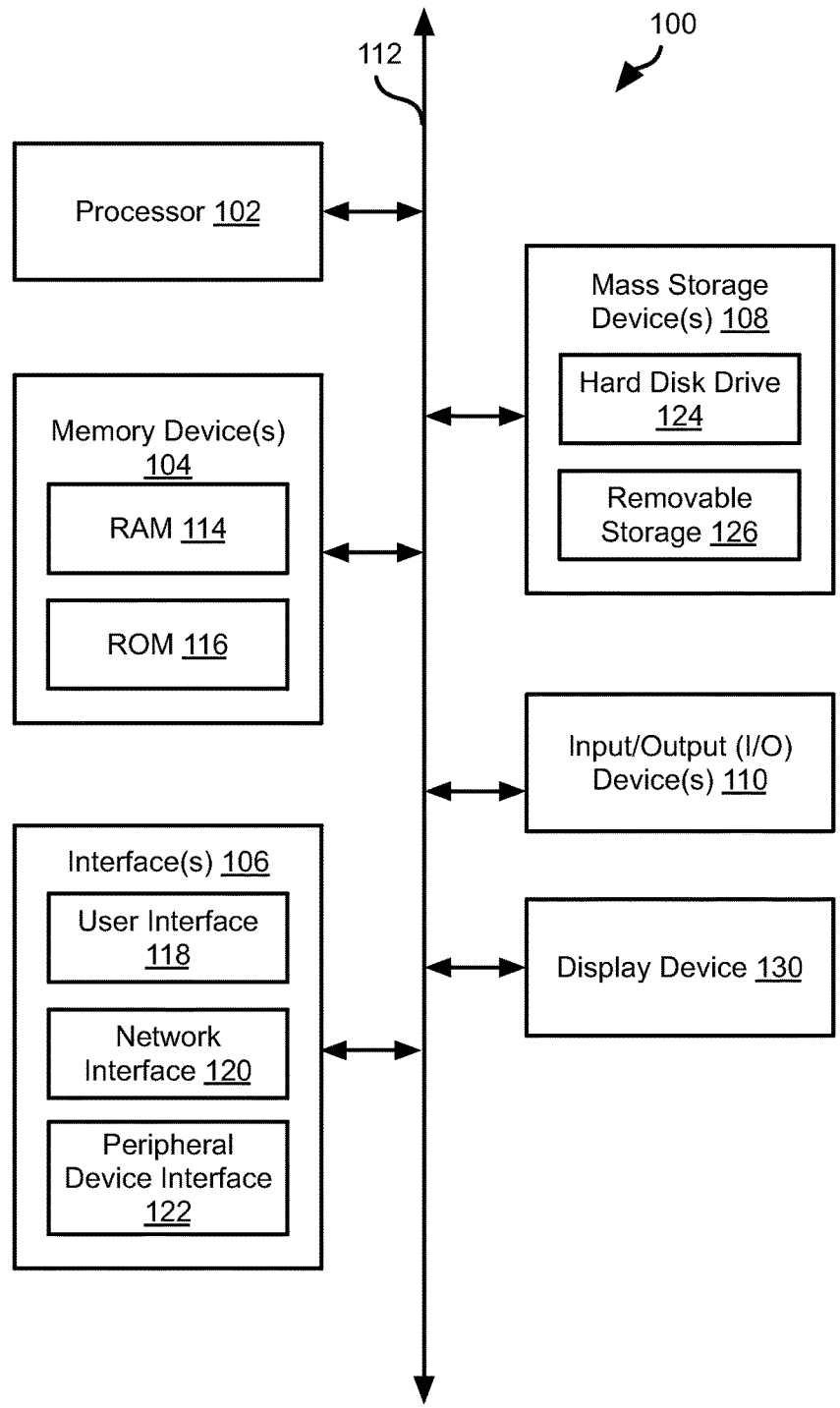
FIG. 1 is a schematic block diagram of a computer system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods performing LDPC decoding. A method is disclosed for performing LDPC decoding, specifically layered min-sum decoding using a Tanner graph including check nodes (CN) and variable nodes (VN). Messages passed between nodes are quantized in a non-uniform manner. Values below a threshold are uniformly quantized whereas values above the threshold are non-uniformly quantized. A corresponding inverse-quantization is also defined.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory)

device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various functions as discussed herein. Computing device 100 can be any of a wide variety of computing devices, such as a desktop computer, a notebook computer, a server computer, a handheld computer, tablet computer and the like. In some embodiments, a hardware device containing circuits implementing the methods disclosed herein may be included in the computing device 100 or embedded in any of the components of the computing device listed below.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
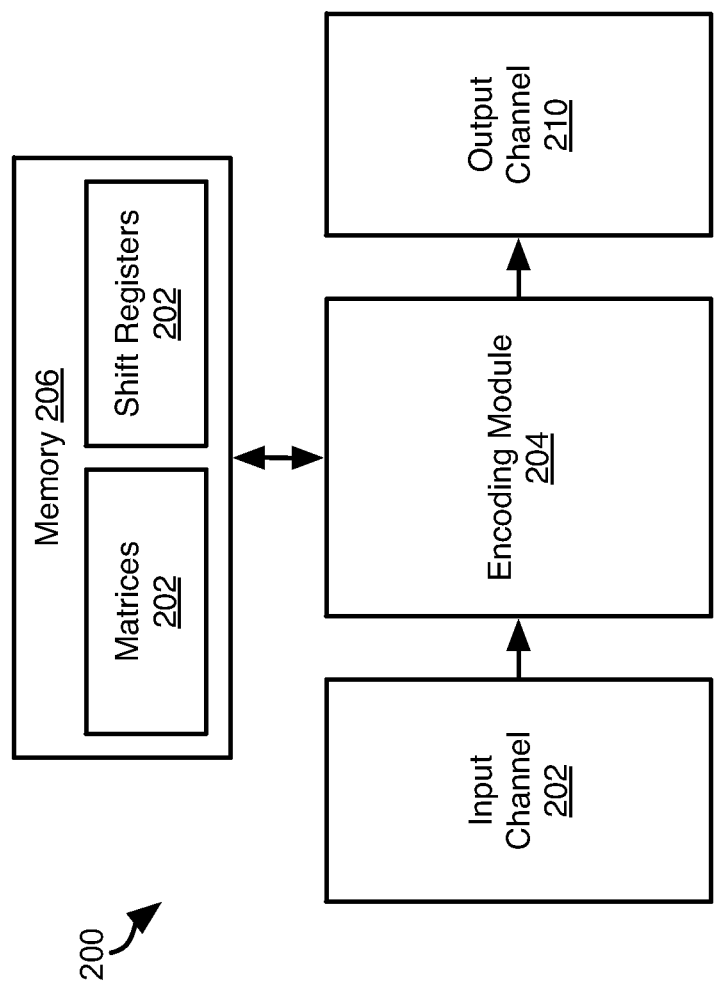
FIG. 2 is a schematic block diagram of components for implementing methods in accordance with embodiments of the invention.

Referring to FIG. 2, the illustrated system 200 may be used to perform the methods disclosed herein. The illustrated components may be specific electronic components or software modules executed by a computing device 100. The system 200 may include an input channel 202 from which data is received. The input channel 202 may be any device or interface. The data from the input channel 202 may be received by an encoding module 204 implementing the methods disclosed herein. As noted above, the encoding module 204 may be implemented by software or hard-coded circuits or a digital processor.

The data received from the input channel 202 may be encoded according to the LDPC encoding algorithm described herein. The encoding module 204 is programmed or configured with circuits implementing the methods disclosed herein in order to perform the decoding. To facilitate decoding, a memory 206 for storing intermediate results and operational data may be coupled to the encoding module 204. The decoding module 204 outputs data to an output channel 210 that is the data from the input channel 202 encoded according to the methods disclosed herein.

The memory 206 may store matrices 212 as discussed hereinbelow, including the inverses of some of them. In particular, matrices 212 may include some or all of matrices H, D, E, T and may include an inverse of some or all of these matrices, particularly $D^{-1}$ as described below. Memory 206 may include shift registers 202 for storing intermediate results of calculations performed when encoding input data. In particular, the methods disclosed herein provide an efficient way of performing encoding using shift registers that reduces requirements for both computation and storage.

Figure 3:
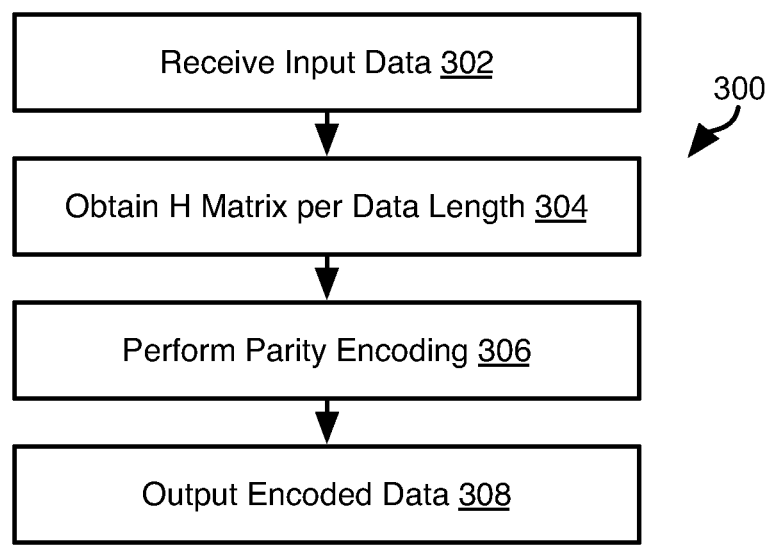
FIG. 3 is a process flow diagram of a method for performing LDPC encoding in accordance with an embodiment of the present invention.

Referring to FIG. 3, the illustrated method 300 may be performed using the system 200 of FIG. 2. The method 300 may include receiving 302 input data word, obtaining 306 an LDPC encoding matrix $H^{(i)}$ of dimensions i×i, where i is the length of the input data word. The method 300 may further including performing 306 parity encoding of the input data word and outputting 308 the encoded data. Outputting the encoded data may include outputting one or more LDPC parity codes for the input data. The methods by which the matrix $H^{(i)}$ is obtained 304 and encoding 306 is performed is described in detail below.

In practice, it is prevailing to design configurable multi-rate codes, in order to effectively combat different level of noise (which may be due to different life stage, different medium, or different failure tolerance, etc.), while minimizing redundancies. For example, one may design a series of LDPC matrixes, $H^{(1)}, H^{(2)}, \ldots, H^{(k)}$, with $m_1, m_2, \ldots, m_k$, rows, respectively. We are interested in a common square sub-matrix D such that $$H_P^{(i)} = \begin{bmatrix} 0 & T^{(i)} \\ D & E^{(i)} \end{bmatrix} \quad (2)$$

where $H_P^{(i)}$ is an m×m matrix and retains the rank of $H^{(i)}$, and $T^{(i)}$ is a lower/upper triangular matrix. Apparently $H^{(1)}, H^{(2)}, \ldots, H^{(k)}$, share the sub-matrix D, but nothing else. Clearly, the above parity sub-matrix format in (2) can be viewed as a special class (by forcing B=0) of the conventional format in (1). E is an arbitrary matrix, the values of which are calculated to improve encoding efficiency of the matrix $H_P^{(i)}$.

For an input message $u=[u_1, u_2, \ldots, u_{n_i-m_i}]$ (note our design does not require the input message to satisfy equal length for all codes), the systematic encoding is to determine the code parity $p \triangleq [p_1, p_1]$ such that $$0 = H^{(i)} \cdot [u, p_1, p_1]^T = H_I^{(i)} \cdot u^T + \begin{bmatrix} 0 \\ D \end{bmatrix} \cdot p_1^T + \begin{bmatrix} T^{(i)} \\ E^{(i)} \end{bmatrix} \cdot p_2^T. \quad (3)$$

Let $D^{-1}$ be the pre-computed (pseudo) inverse of D. The encoding procedure may then be performed as follows:

Unified H-Encoding Algorithm
Input: u
1. Compute $[s_1, s_2]^T \leftarrow -H_I^{(i)} \cdot u^T$
2. Solve $p_2$ through the equation $T^{(i)} \cdot p_2^T = s_1^T$ by back-substitution
3. Compute $s'_2{}^T \leftarrow s_2^T - E^{(i)} \cdot p_2^T$
4. Compute $p_1^T \leftarrow D^{-1} \cdot s'_2{}^T$
Output: $c=[u, p_1, p_2]$ Note the above algorithmic description applies to general fields. Steps 1-3 involve only sparse operations, thus the corresponding storage and computation are both greatly reduced. In Step 4, $D^{-1}$ is pre-computed and common for all code rates, though it is dense in general. Therefore, the design entails dramatically less encoding hardware while still leaving sufficient degrees of freedom for code optimization, comparing to the conventional encoder using G-matrix or decomposition in (1). In particular, the design allows encoding of multi-rate codes with little add-on storage. Moreover, when regular column weight is enforced, the storage and computation complexities remain same for different code redundancies, however, they become proportional to the code redundancy when G-matrix multiplication is carried out.

For a given code rate, the row and column weight distributions of H matrix are mainly determined by the density evolution to optimize its waterfall performance [1]. Given row and column weights, greedy methods based on progressive-edge-growth [7-9] can be exploited to enforce the special property of $H_P$ in (2) while minimizing the error floor. It is worth noting that columns (rows) of the H matrix can be freely shuffled without changing code properties. The common sub-matrix D may be designed to satisfy the following constraints:

(i). It approaches the maximum rank. This is a sufficient but also simple condition to ensure the parity sub-matrix HP retains the rank of entire H matrix.
(ii). It approaches maximum girth and does not contain small trapping sets. This is to ensure that D alone does not create the performance bottleneck.
(iii). Its (pseudo) inverse must be in simple format. In particular, it is desirable to yield a pseudo QC $D^{-1}$ when QC D is singular.

A simplification of the above encoding is to further make D in the form of (2), such that $$D = \begin{bmatrix} 0 & T' \\ D' & E' \end{bmatrix} \quad (4)$$

where T' is a triangular matrix in the same lower/upper manner as $T^{(i)}$. Then, the dense storage and computation concerns only $D'^{-1}$. However, such a nice decomposition is not guaranteed, since D must follow all three design criteria listed in the preceding paragraph. Another simplification is to force $T^{(i)}$, i=1, 2, ..., k, to be identity matrixes, then Step 2 is eliminated. However, this restraint may severely affect code performance when its dimension is large.

When QC-LDPC codes with b×b circulants are considered, we enforce an additional criterion that all sub-matrixes must also satisfy QC property. Specifically, D, $D^{-1}$, $T^{(i)}$, $E^{(i)}$, $H_I^{(i)}$, i=1, 2, ..., k, must be in QC format. When QC D is enforced in full rank, then $D^{-1}$ naturally retains QC property. On the other hand, when there is no way to enforce D in full rank due to certain design constraints, say regular even column weight, then it is non-trivial to find a QC D such that its pseudo inverse $D^{-1}$ falls also into QC structure. By this way, both storage and computation are further simplified. Specifically, we only need to store the shift index (in [$\log_2$ b] bits) of the 1 in the first row for each circulant in $T^{(i)}$, $E^{(i)}$, $H_I^{(i)}$, i=1, 2, ..., k, and the first row (in b bits) of each circulant in $D^{-1}$, whereas a b×b random matrix must be saved with $b^2$ bits. Moreover, the operations involved in Steps 1-3 are merely barrel shifter and circulant-wise XOR (combined into one cycle), and thus achieve very high throughput with little circuit. Step 4 uses circular shift registers for each bit calculation and takes b cycles for each circulant multiplication (same as in QC-G matrix multiplication). However, the circulant number of D only accounts for a small fraction of H, thus Step 4 is executed in short latency as well (whereas the number of dense circulants in QC-G matrix is orders of magnitude greater than that of $D^{-1}$).

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope

REFERENCES

[1] J. Chen, A. Dholakia, E. Eleftheriou, M. P. C. Fossorier, and X.-Y. Hu, "Reduced-complexity decoding of LDPC codes", IEEE Trans. Commun., vol. 53, no. 8, pp. 1288-1299, August 2005.
[2] M. Mansour and N. Shanbhag, "High-throughput LDPC decoders," IEEE Trans. VLSI Systems, vol. 11, no. 6, pp. 976-996, 2003.
[3] D. E. Hocevar, "A reduced complexity decoder architecture via layered decoding of LDPC codes, Proc. IEEE Workshop Signal Process. Syst. (SIPS), Austin, Tex., pp. 107-112, October 2004.
[4] S. Kim, G. E. Sobelman, and H. Lee, "A reduced-complexity architecture for LDPC layered decoding scheme," IEEE Trans. VLSI Systems, vol. 19, no. 6, pp. 1099-1103, June 2011.
[5] X. Zhang and P. Siegel, "Quantized iterative message passing decoders with low error floor for LDPC codes," IEEE Trans. Commun., vol. 62, no. 1, pp. 1-14, January 2014.
[6] J. Zhang and M. P. C. Fossorier, "Shuffled iterative decoding," IEEE Trans. Commun., vol. 53, no. 2, pp. 209-213, January 2005.

What is claimed is:
1. A method comprising:
receiving, by an electronic device, a plurality of input data words u having a plurality of different lengths; and
generating, by the electronic device, encoded data c for each input word u by encoding the input data using one or more quasi cyclic low density parity check (LDPC) codes based on a series of structured parity check matrixes $H^{(i)}$, i=1, 2, ..., k, of the form

$$H_P^{(i)} = \begin{bmatrix} 0 & T^{(i)} \\ D & E^{(i)} \end{bmatrix},$$

where the subscript $_P$ denotes the parity submatrix, $T^{(i)}$ is one of an upper and lower triangular matrix, and E and D are arbitrary low density matrices and wherein D is identical for each parity check matrix, $H^{(i)}$=1, 2, ..., k, regardless of the lengths thereof;
determining $[s_1, s_2]^T \leftarrow -H^{(i)} \cdot u^T$, where $H_I^{(i)}$ is an identity matrix of dimensions i×i;
determining $p_2$ through the equation $T^{(i)} \cdot p_2^T = s_1^T$ by back-substitution;
determining $s'_2{}^T \leftarrow s_2^T - E^{(i)} \cdot p_2^T$;
determining $p_1^T \leftarrow D^{-1} \cdot s'_2{}^T$; and
outputting the encoded data c as $[u, p_1, p_2]$ for each input word u.

2. The method of claim 1, wherein $$= \begin{bmatrix} 0 & T' \\ D' & E' \end{bmatrix},$$

wherein D' and E' are arbitrary and T' is one of an upper and a lower triangular matrix in a same manner as $T^{(i)}$.

3. The method of claim 1, wherein $D^{-1}$ is pre-computed and is identical for each input data word u regardless of length.

4. The method of claim 1, wherein D, $D^{-1}$, $T^{(i)}$, $E^{(i)}$, $H_I^{(i)}$ are all quasi-cyclic for all i.

5. The method of claim 1, wherein generating, by the electronic device, encoded data c for each input word u further comprises storing for each of D, $D^{-1}$ and for $T^{(i)}$, $E^{(i)}$ for each i a first 1 in a first row for each circulant of D, $D^{-1}$, $T^{(i)}$, $E^{(i)}$.

6. The method of claim 1, wherein determining $[s_1, s_2]^T$, $p_2$, and $s'_2{}^T$, each comprise performing barrel shifter and circulant-wise XOR operations combined into a single cycle.

7. The method of claim 1, wherein determining $p_1^T$ comprises using circular shift registers for calculation of each bit of $p_1^T$.

8. The method of claim 1, wherein D has the following properties:
(i) D approaches maximum rank;
(ii) D approaches maximum girth and does not contain small trapping sets;
(iii) a pseudo inverse of D is in simple format such that the pseudo inverse $D^{-1}$ is quasi cyclic when D is singular.

9. The method of claim 1, wherein $T^{(i)}$ is an identity matrix for all i.

10. A system comprising:
a processing device implementing an encoding module programmed to:
receive a plurality of input data words u having a plurality of different lengths; and
generate encoded data c for each input word u by encoding the input data using one or more quasi cyclic low density parity check (LDPC) codes based on a series of structured parity check matrixes $H^{(i)}, i = 1, 2, \ldots, k$, of the form $H_P^{(i)} = \begin{bmatrix} 0 & T^{(i)} \\ D & E^{(i)} \end{bmatrix}$, where the subscript $_P$ denotes the parity submatrix, $T^{(i)}$ is one of an upper and lower triangular matrix, and E and D are arbitrary low density matrices and wherein D is identical for each parity check matrix, $H^{(i)}$, i=1, 2, ..., k, regardless of the lengths thereof;
  determine $[s_1,s_2]^T \leftarrow -H_I^{(i)} \cdot u^T$, where $H_I^{(i)}$ is an identity matrix of dimensions i×i;
  determine $p_2$ through the equation $T^{(i)} \cdot p_2^T = s_1^T$ by back-substitution;
  determine $s'_2{}^T \leftarrow s_2{}^T - E^{(i)} \cdot p_2{}^T$;
  determine $p_1{}^T \leftarrow D^{-1} \cdot s'_2{}^T$; and
  output the encoded data c as $[u,p_1,p_2]$ for each input word u.

11. The system of claim 10, wherein $= \begin{bmatrix} 0 & T' \\ D' & E' \end{bmatrix}$, wherein D' and E' are arbitrary and T' is one of an upper and a lower triangular matrix in a same manner as $T^{(i)}$.

12. The system of claim 10, further comprising a memory storing D and $D^{-1}$; wherein $D^{-1}$ is pre-computed and is identical for each input data word u regardless of length.

13. The system of claim 10, wherein D, $D^{-1}$, $T^{(i)}$, $E^{(i)}$, $H_I^{(i)}$ are all quasi-cyclic for all i.

14. The system of claim 10, wherein the encoding module is further programmed to generate the encoded data c for each input word u by storing in a memory for each of D, $D^{-1}$ and for $T^{(i)}$, $E^{(i)}$ for each i a first 1 in a first row for each circulant of D, $D^{-1}$, $T^{(i)}$, $E^{(i)}$.

15. The system of claim 10, wherein a memory comprises one or more shift registers and wherein the encoding module is further programmed to determine $[s_1,s_2]^T$, $p_2$, and $s'_2{}^T$ by barrel shifter and circulant-wise XOR operations using the one or more shift registers and combined into a single cycle.

16. The system of claim 10, wherein one or more shift registers include one or more circular shift registers and wherein the encoding module is further programmed to determine $p_1{}^T$ by using the one or more circular shift registers for calculation of each bit of $p_1{}^T$.

17. The system of claim 10, wherein D has the following properties:
  (i) D approaches maximum rank;
  (ii) D approaches maximum girth and does not contain small trapping sets;
  (iii) a pseudo inverse of D is in simple format such that the pseudo inverse $D^{-1}$ is quasi cyclic when D is singular.

18. The system of claim 10, wherein $T^{(i)}$ is an identity matrix for all i.

\* \* \* \* \*